(12) United States Patent
Shuto

(10) Patent No.: US 6,172,897 B1
(45) Date of Patent: Jan. 9, 2001

(54) SEMICONDUCTOR MEMORY AND WRITE AND READ METHODS OF THE SAME

(75) Inventor: Susumu Shuto, Yokohama (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/393,183

(22) Filed: Sep. 10, 1999

(30) Foreign Application Priority Data

Sep. 11, 1998 (JP) .................................................. 10-258805

(51) Int. Cl.$^7$ ...................................................... G11C 11/22
(52) U.S. Cl. ............................................. 365/145; 365/149
(58) Field of Search ..................................... 365/145, 149

(56) References Cited

U.S. PATENT DOCUMENTS 5,608,667 * 3/1997 Osawa ................................... 365/145
5,774,392 * 6/1998 Kraus et al. .......................... 365/145

OTHER PUBLICATIONS

International Electron Devices Meeting 1987, Technical Digest pp. 850–851, "A Non–Volatile Memory Cell Based on Ferroelectric Storage Capacitors", W. I. Kinney et al.

* cited by examiner

Primary Examiner—Huan Hoang
(74) Attorney, Agent, or Firm—Banner & Witcoff, Ltd.

(57) ABSTRACT

As a ferroelectric memory cell arrangement, one terminal of a ferroelectric capacitor is connected to a word line. This eliminates a plate line that is conventionally necessary and enables write and read by controlling only a word line and a bit line. No need for a driver circuit for driving a plate line facilitates control of write and read operations and design of control line potential timings. This reduces the circuit scale and the chip size.

9 Claims, 21 Drawing Sheets

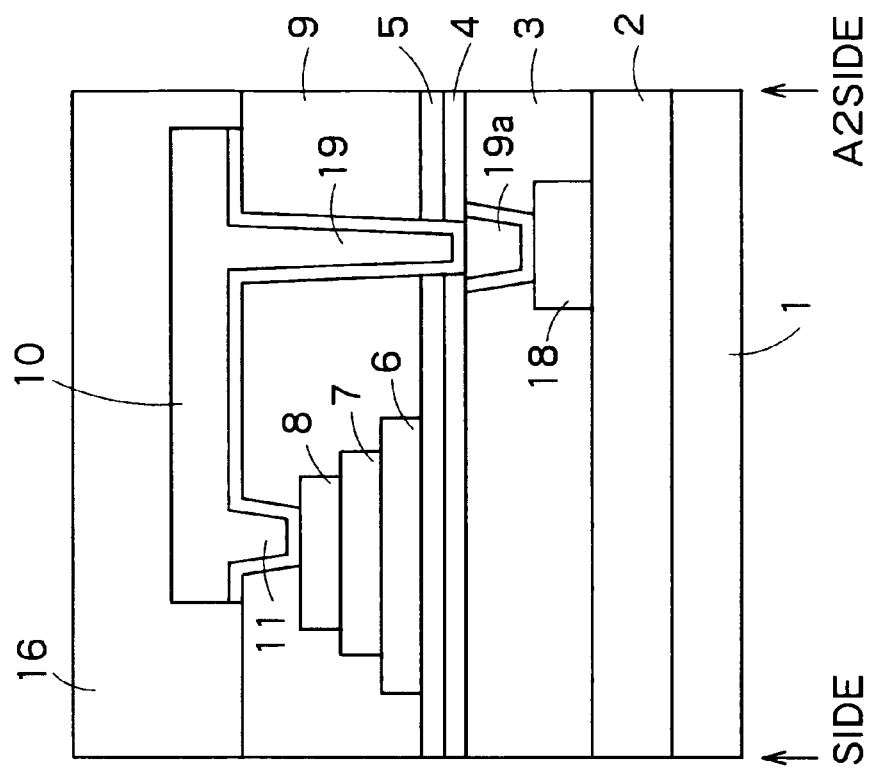
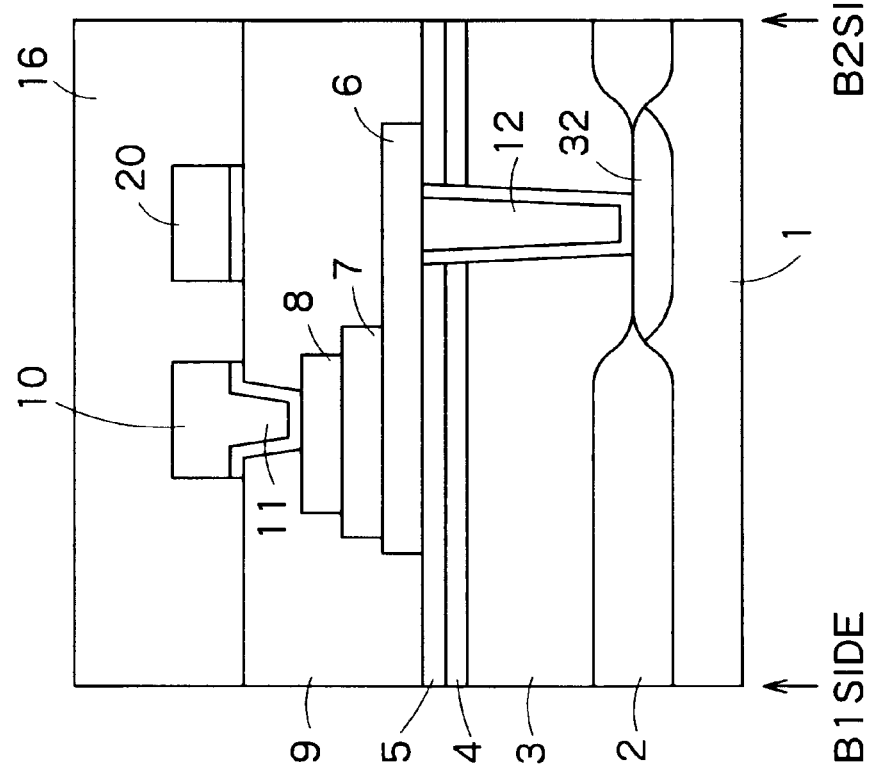
FIG. 3B
FIG. 3A

| STEP | "0" WRITE | | | | "1" WRITE | | | |
|---|---|---|---|---|---|---|---|---|
| | BL | WL | NA | NB | CAPACITOR POLARIZATION | BL | WL | NA | NB | CAPACITOR POLARIZATION |
| (a) | GND | -Vcc | GND | -Vcc | → | GND | -Vcc | GND | -Vcc | → |
| (b) | GND | Vcc | GND | Vcc | ← | Vcc | Vcc | Vcc | Vcc | NO CHANGE |
| (c) | GND | GND | GND | GND | NO CHANGE | GND | GND | GND | GND | NO CHANGE |

FIG. 6

| STEP | "0" READ | | | | "1" READ | | | |
|---|---|---|---|---|---|---|---|---|
| | BL | WL | NA | NB | CAPACITOR POLARIZATION | BL | WL | NA | NB | CAPACITOR POLARIZATION |
| (a) | GND | GND | GND | GND | | GND | GND | GND | GND | |
| (b) | GND→GND | Vcc | GND→GND | Vcc | ↑ | GND→H | Vcc | GND→H | Vcc | ↓ |
| (c) | GND | GND | GND | GND | NO CHANGE | →GND | GND | H | GND | NO CHANGE |

FIG. 7

| STEP | "0" WRITE | | | | | "1" WRITE | | | | |
|---|---|---|---|---|---|---|---|---|---|---|
| | BL | WL | NA | NB | SUBSTRATE | CAPACITOR POLARIZATION | BL | WL | NA | NB | SUBSTRATE | CAPACITOR POLARIZATION |
| (a) | Vcc | GND | Vcc | Vcc | GND | Vcc | → | Vcc | GND | Vcc | Vcc | GND | Vcc | → |
| (b) | GND | Vcc | GND | Vcc | GND | ↑ | Vcc | Vcc | Vcc | GND | GND | NO CHANGE |
| (c) | GND | GND | GND | GND | GND | NO CHANGE | GND | GND | GND | GND | GND | NO CHANGE |

FIG. 11

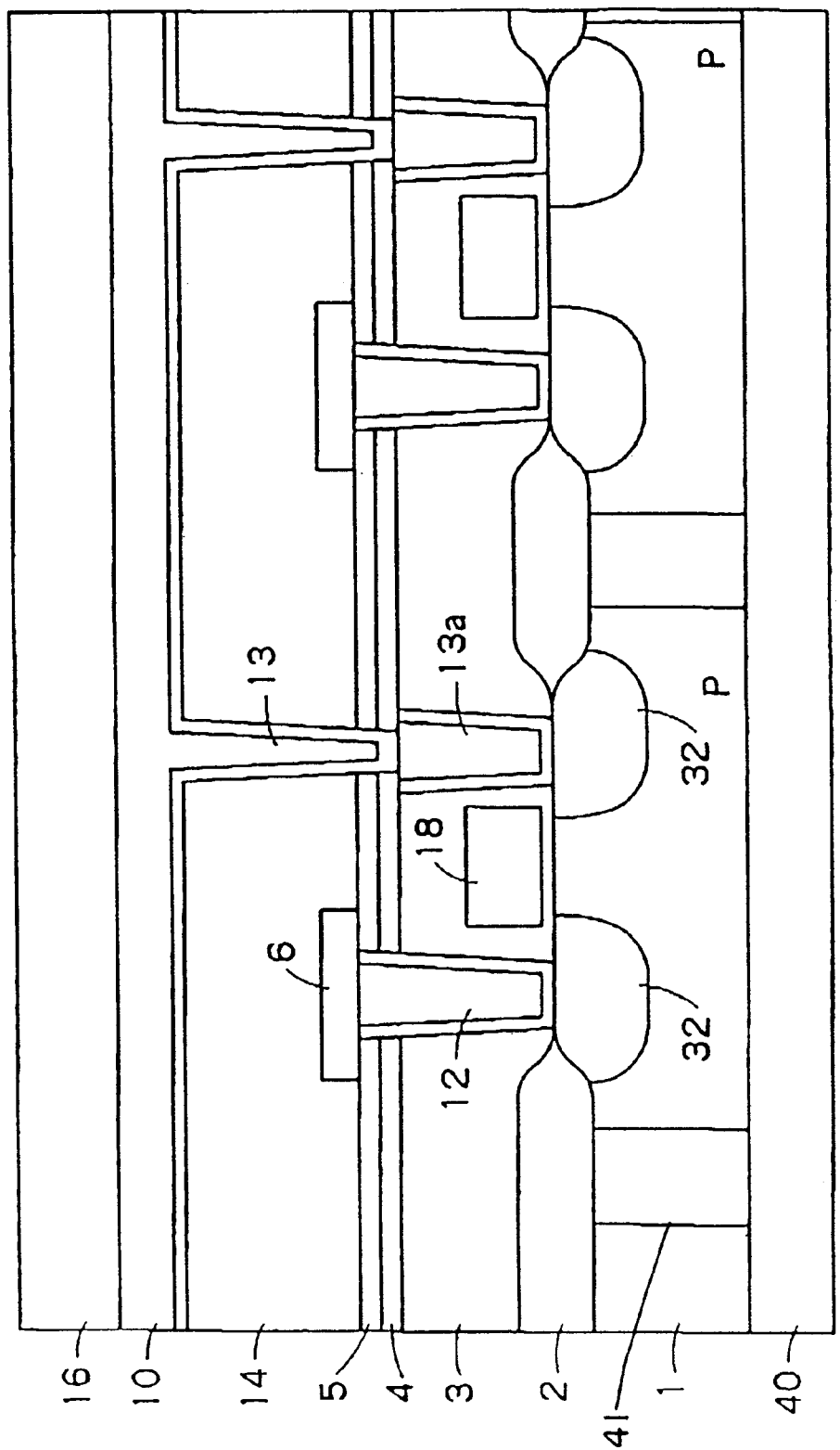
F I G. 15

| STEP | "0" WRITE | | | | "1" WRITE | | | |
| --- | --- | --- | --- | --- | --- | --- | --- | --- |
| | BL | WL | PL | CAPACITOR POLARIZATION | BL | WL | PL | CAPACITOR POLARIZATION |
| (a) | GND | Vcc+Vth | GND | NO CHANGE | Vcc | Vcc+Vth | GND | ↓ |
| (b) | GND | Vcc+Vth | Vcc | ↑ | Vcc | Vcc+Vth | Vcc | NO CHANGE |
| (c) | GND | Vcc+Vth | GND | NO CHANGE | Vcc | Vcc+Vth | GND | NO CHANGE |

| STEP | "0" READ | | | | "1" READ | | | |
|---|---|---|---|---|---|---|---|---|
| | BL | WL | PL | CAPACITOR POLARIZATION | BL | WL | PL | CAPACITOR POLARIZATION |
| (a) | GND | GND | GND | ↑ | GND | GND | GND | ↓ |
| (b) | GND→GND | Vcc | Vcc | ↑ | GND→H | Vcc | Vcc | ↑ |
| (c) | GND | GND | GND | ↑ | →GND | GND | GND | ↑ |

SEMICONDUCTOR MEMORY AND WRITE AND READ METHODS OF THE SAME

BACKGROUND OF THE INVENTION

The present invention relates to a semiconductor memory, particularly a ferroelectric memory, and write and read methods of the same.

A semiconductor memory, particularly a ferroelectric memory, related to the present invention includes cells each having an arrangement as shown in FIG. 21. That is, each cell has one transistor Tr and one capacitor C. One terminal of the capacitor C is connected to one of the source and drain diffusion layers of the transistor Tr. The other terminal of the capacitor C is connected to a plate line PL. The gate of the transistor Tr is connected to a word line WL. The other of the source and drain diffusion layers is connected to a bit line BL.

A write operation to the cell having this arrangement will be described below with reference to FIG. 22. In FIG. 22, arrows indicate the directions of polarization P. For example, an upward arrow "↑" indicates that the capacitor polarization direction is from an electrode connected to the plate line PL to an electrode connected to the transistor Tr. Conversely, a downward arrow "↓" indicates that the capacitor polarization direction is from the electrode connected to the transistor Tr to the electrode connected to the plate line PL.

As shown in FIG. 22, the write operation is performed in three steps (a), (b), and (c). In step (a), a ground voltage Vss or a power supply voltage Vcc is applied in accordance with data to be written in the bit line BL. That is, the ground voltage Vss is applied when "0" data is to be written, and the power supply voltage is applied when "1" data is to be written. Letting Vth be the threshold voltage of the transistor Tr, Vcc+Vth is applied to the word line WL, and the ground voltage Vss is applied to the plate line PL. In this step, when "0" data is to be written, the polarization of the capacitor C remains unchanged. When "1" data is to be written, downward polarization is stored in the capacitor C.

In step (b), the potentials of the bit line BL and the word line WL are not changed from those in step (a), and only the plate line PL is changed to the power supply voltage Vcc. Consequently, upward polarization is stored in the capacitor C when "0" data is to be written, and the polarization of the capacitor C remains unchanged when "1" data is to be written.

In final step (c), the plate line PL is returned to the ground voltage Vcc. In this step, the polarization of the ferroelectric capacitor C remains the same.

In the above three steps, upward or downward polarization is stored in the ferroelectric capacitor C in accordance with the potential applied to the bit line BL. Next, an operation of reading out written data will be described below with reference to FIG. 23 showing the read procedure and a timing chart of FIG. 24 showing potential changes on the individual control lines.

Step (a) corresponds to a precharge cycle in which the bit line BL is grounded. At this stage, a sense amplifier (not shown) for reading the potential of the bit line BL is kept disconnected from the bit line BL. Both the word line WL and the plate line PL are grounded. In this step, the polarization direction stored in the capacitor C remains unchanged.

In step (b), the power supply voltage Vcc is applied to the word line WL and the plate line PL. If "0" data, i.e., upward polarization is stored in the ferroelectric capacitor C, the polarization direction in the capacitor C does not change. Accordingly, the potential of the bit line BL also remains unchanged from the ground voltage Vss. However, if "1" data, i.e., downward polarization is stored in the ferroelectric capacitor C, the polarization direction in the capacitor C changes from downward to upward. In accordance with this polarization inversion, electric charge from the ferroelectric capacitor C moves to the bit line BL. Consequently, the potential of the bit line BL rises from the ground voltage Vss to, e.g., about 0.7 V.

In step (c), the potential of the plate line PL is returned to the ground voltage Vss. In this step, no polarization change occurs in the ferroelectric capacitor C. In step (b), however, the potential of the bit line BL remains at the ground voltage Vss when "0" data is written, and has risen to about 0.7 V when "1" data is written. This potential difference is finally amplified and read out by a sense amplifier (not shown). Since this read operation destroys the stored data in the ferroelectric capacitor C, the write operation must be again performed subsequently to the read operation.

FIG. 25 shows the circuit configuration of a ferroelectric memory related to the present invention. This ferroelectric memory includes a cell array 121 in which cells each having the aforementioned arrangement are arranged in a matrix, a word line driver 123 for driving the word line WL, a plate line driver 125 for driving the plate line PL, a sense amplifier and a bit line driver 124 for driving the bit line BL and amplifying and reading out the potential of this bit line BL, and a controller 122 for controlling the word line driver 123, the plate line driver 125, the sense amplifier, and the bit line driver 124.

This ferroelectric memory, however, requires the three control lines, i.e., the bit line BL, the word line WL, and the plate line PL, to drive the cells, and design of timings for driving at different timings is cumbersome. Additionally, driving the potentials of these control lines requires the word line driver 123, the plate line driver 125, the sense amplifier, the bit line driver 124, and the controller 122 for controlling these components. This complicates the circuit configuration and leads to an increase in the chip size.

SUMMARY OF THE INVENTION

It is, therefore, an object of the present invention to provide a semiconductor memory which facilitates operation control and timing design and can reduce the circuit scale and the chip size, and write and read methods of the same.

A semiconductor memory according to the present invention comprises a cell including one transistor and one ferroelectric capacitor formed on the same semiconductor region, in which one of a source and drain of said transistor is connected to one terminal of said ferroelectric capacitor, a bit line connected to the other of said source and drain of said transistor, and a word line connected to the other terminal of said ferroelectric capacitor and a gate of said transistor.

A semiconductor memory according to the present invention comprises a plurality of cells and a plurality of word lines, a plurality of semiconductor regions having a different conductivity type from a conductivity type of a semiconductor substrate and electrically isolated from each other are formed on the semiconductor substrate, and at least one of the plurality of cells is formed in each of the semiconductor regions, the cells formed in each semiconductor region being connected to the same word line.

This semiconductor memory may comprise a plurality of cells each connected to one of a plurality of word lines, and, in a write operation, a predetermined voltage may be applied between a selected word line and a semiconductor substrate in which a cell connected to the selected word line is formed, and no voltage may be applied between an unselected word line and a semiconductor substrate in which a cell connected to the unselected word line is formed.

A semiconductor memory according to the present invention comprises a memory cell array in which a plurality of cells are arranged, a word line driver for driving the word line, a bit line driver for writing data in the cells by driving the bit line, and a sense amplifier for reading out data from the cells on the basis of a potential of the bit line.

A method of writing data in a semiconductor memory according to the present invention comprises the first step of applying a first voltage, which generates polarization in a first direction in the ferroelectric capacitor, between the semiconductor region in which the cell is formed and the word line, and the second step of applying a fourth voltage which turns on the transistor while a second or third voltage is applied to the bit line, if the second voltage is applied to the bit line, writing first data while the first polarization is kept generated in the ferroelectric capacitor, and, if the third voltage is applied to the bit line, writing second data while polarization in a second direction different from the direction of the first polarization is generated in the ferroelectric capacitor.

The polarity of the first voltage may be negative when the transistor is an n-type field-effect transistor.

A method of reading out data stored in a cell of a semiconductor memory according to the present invention comprises the first step of precharging the bit line to a ground potential, the second step of applying a first voltage to the word line, maintaining a polarization direction in the ferroelectric capacitor if first data is stored in the cell, and changing the polarization direction in the ferroelectric capacitor if second data is stored in the cell, thereby changing a potential of the bit line, and the third step of grounding the word line to read out the data on the basis of the potential of the bit line.

As described above, in the semiconductor memory and the write and read methods of the same according to the present invention, in writing or reading data in or from a cell, it is only necessary to control the potentials of two control lines, i.e., a word line and bit line. This facilitates designing control timings and designing a potential control circuit. This can also contribute to reduction of the circuit scale.

BRIEF DESCRIPTION OF THE DRAWINGS

FIGS. 3A and 3B are sectional views showing longitudinal sectional structures taken along a line B1–B2 and a line A1–A2, respectively, in FIG. 2;

FIG. 6 is a view showing the procedure of write operation of the semiconductor memory;

FIG. 7 is a view showing the procedure of read operation of the semiconductor memory;

FIG. 11 is a view showing the procedure of a write method of a semiconductor memory according to the second embodiment of the present invention;

FIG. 15 is a sectional view showing a structure in which the cell according to the second embodiment is formed using an SOI substrate;

FIG. 22 is a view showing the procedure of a write method of the semiconductor memory;

FIG. 23 is a view showing the procedure of a read method of the semiconductor memory;

DESCRIPTION OF THE PREFERRED EMBODIMENTS

An embodiment of the present invention will be described below with reference to the accompanying drawings.

Figure 1:
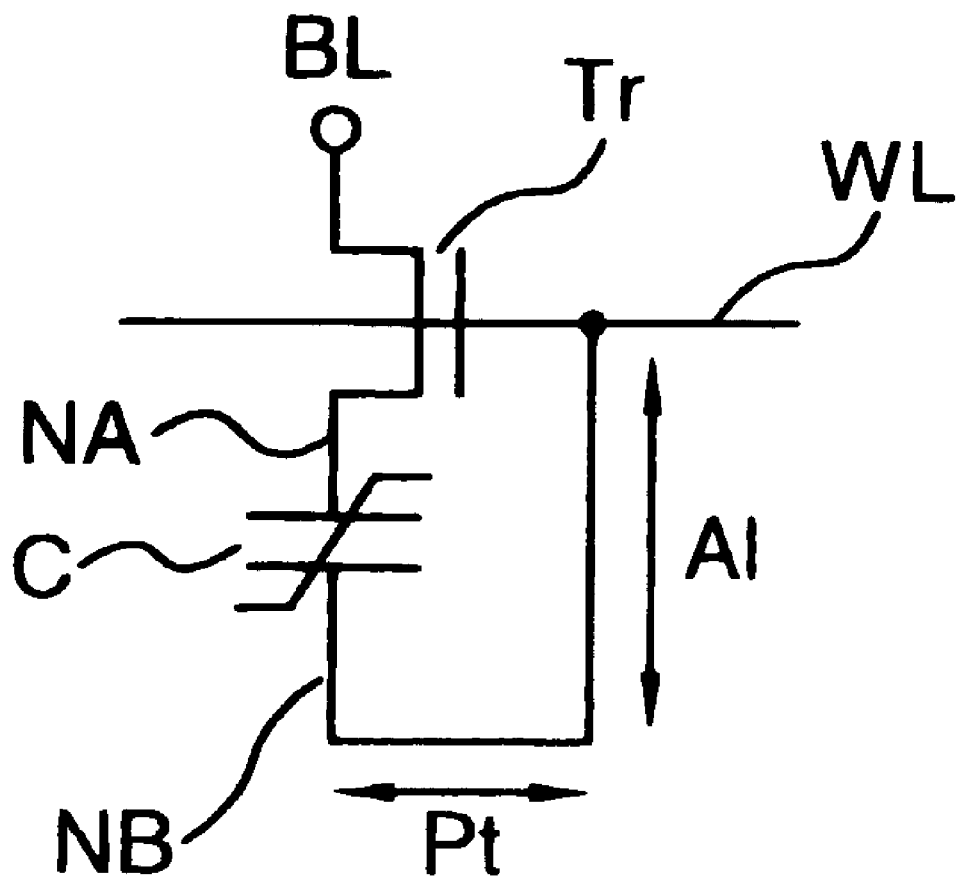
FIG. 1 is a circuit diagram showing the arrangement of a cell in a semiconductor memory according to the first embodiment of the present invention.

A semiconductor memory according to this embodiment includes memory cells each having a circuit configuration as shown in FIG. 1. One memory cell has one transistor Tr and one ferroelectric capacitor C. One of the source and drain diffusion layers of the transistor Tr is connected to a bit line BL, and the other is connected to one terminal of the ferroelectric capacitor C. The gate of the transistor Tr and the other terminal of the ferroelectric capacitor C are connected together to a word line WL. In the memory cell shown in FIG. 21, the other terminal of the ferroelectric capacitor C is connected to the plate line PL. This embodiment differs from the above prior art in that the other terminal of this capacitor C is connected to the word line WL.

Figure 21:
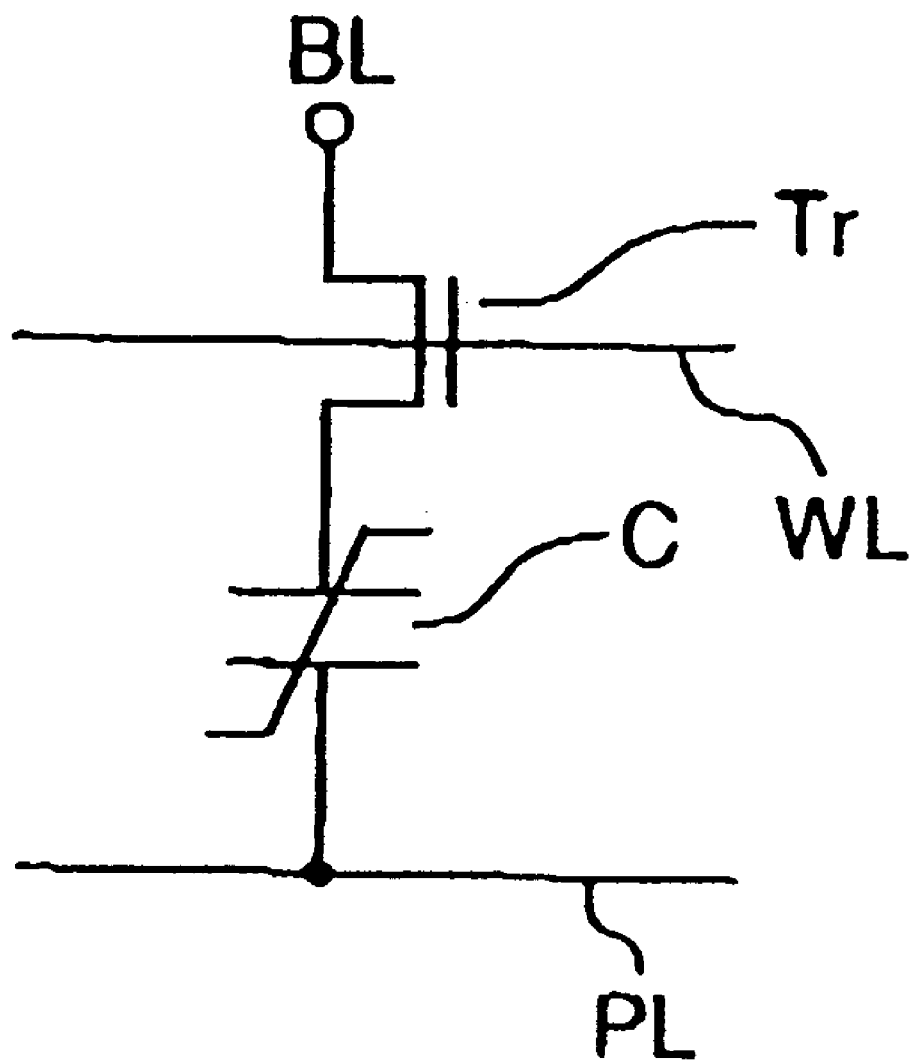
FIG. 21 is a circuit diagram showing the arrangement of a cell in a semiconductor memory relevant to the present invention.
Figure 24:
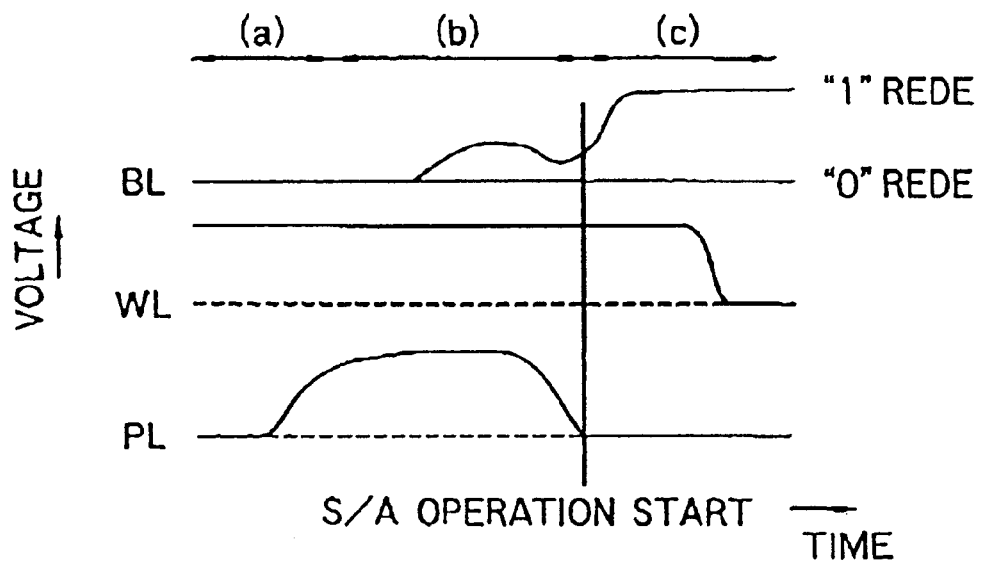
FIG. 24 is a timing chart showing potential changes in a bit line, word line, and plate line over time when data is read out from the semiconductor memory.

Also, in the memory cell shown in FIG. 21, the plate line PL connected to the ferroelectric capacitor C is generally made of platinum (Pt). This is to protect the plate line PL from being oxidized by the influence of annealing performed in an oxidizing atmosphere in the step of forming the ferroelectric capacitor C. However, platinum has a higher resistance than those of common interconnecting materials such as aluminum and hence leads to signal propagation delay.

In the cell shown in FIG. 1, on the other hand, of an interconnecting line for connecting the ferroelectric capacitor C and the word line WL, a portion directly connected to the electrode of the ferroelectric capacitor C is made of platinum, and the other portion connected to the word line is made of an interconnecting material, such as aluminum, having a small resistance value. With this arrangement, delay of the operating speed can be suppressed.

Figure 2:
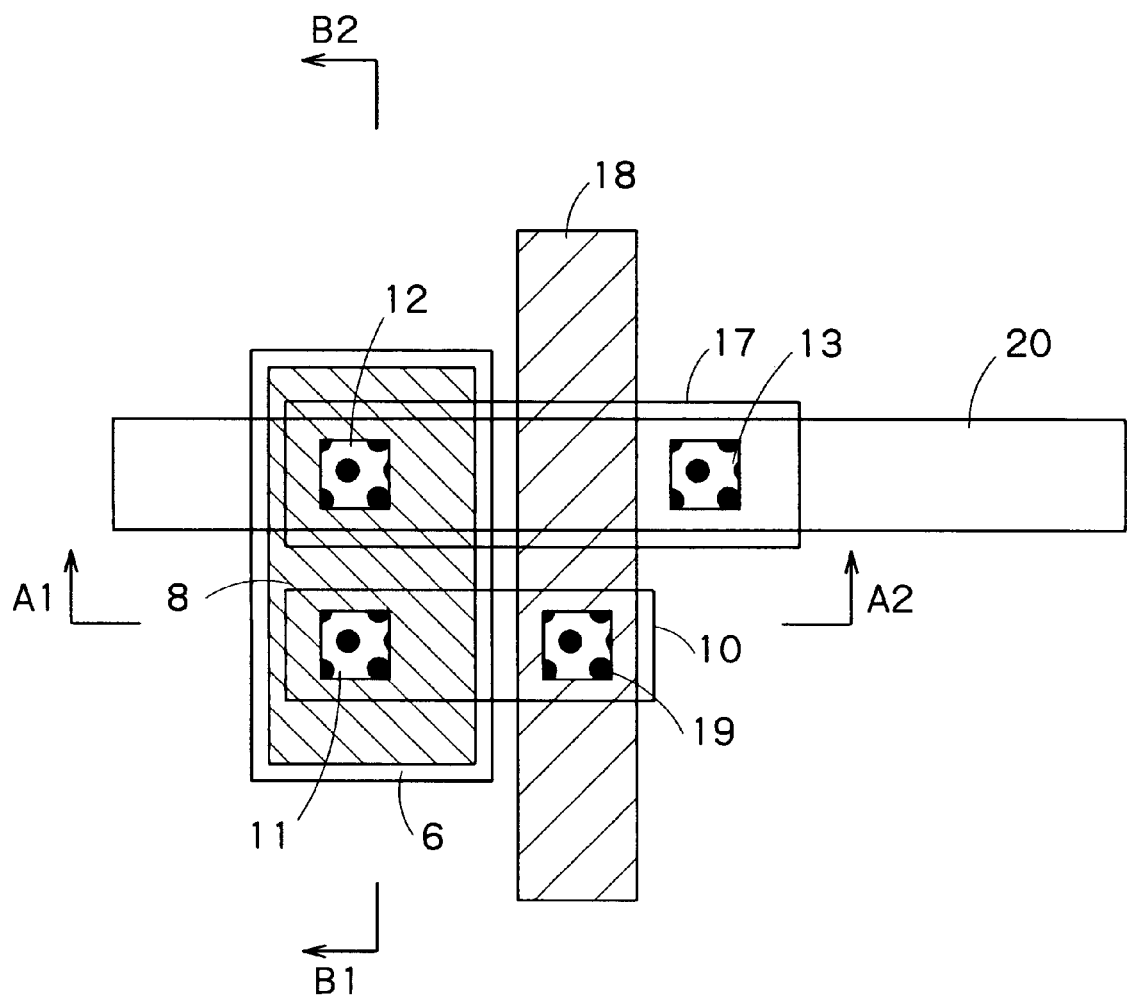
FIG. 2 is a plan view showing an example using a COP as a plane structure of the cell shown in FIG. 1.

The plane structure of this device is shown in FIG. 2. FIG. 3A shows a longitudinal sectional structure taken along a line B1–B2 in FIG. 2. FIG. 3B shows a longitudinal sectional structure taken along a line A1–A2 in FIG. 2.

A diffusion layer 32 and a gate electrode 18 of the transistor Tr are formed in an element region on the surface of a semiconductor substrate 1 containing silicon. This element region is isolated by an element isolation region 2. A first insulating interlayer 3 such as a BPSG film is formed on the surface of this element isolation region. A silicon nitride film 4 and a silicon oxide film 5 are formed on the surface of this insulating interlayer 3.

A contact hole 12 is formed through the insulating interlayer 3, the silicon nitride film 4, and the silicon oxide film 5 and filled with a titanium film, titanium nitride film, and refractory metal such as tungsten. This contact hole 12 connects the diffusion layer 32 to a lower electrode 6 (to be described later) of the capacitor C.

A contact hole 19a is formed in the insulating interlayer 3 and filled with a titanium film, titanium nitride film, and refractory metal such as tungsten. This contact hole 19a connects with a contact hole 19 (to be described later) and thereby connects the gate electrode 18 to an interconnecting layer 10.

On the surface of the silicon oxide film 5, titanium and platinum, for example, are vapor-deposited in this order by sputtering. A PZT film made of lead zirconate titanate is formed on the surface, and platinum is further deposited by evaporation on the surface of this PZT film. Patterning is performed from the upper to the lower film to form an upper electrode 8, a ferroelectric film 7, and the lower electrode 6. These components construct the FRAM capacitor C.

A second insulating interlayer 9 is formed using, e.g., a d-TEOS film so as to entirely cover the capacitor C and the silicon oxide film 5.

A contact hole 11 and the contact hole 19 are formed in this insulating interlayer 9. The contact hole 11 is formed to connect the upper electrode 8 to the interconnecting layer 10 (to be described below). The contact hole 19 is formed to connect the gate electrode 18 to the interconnecting layer 10 via the contact hole 19a. The interconnecting layer 10 and an interconnecting layer 20, which serve as first interconnecting layers, are formed on the surface of the insulating interlayer 9. The interconnecting layer 10 connects the upper electrode 8 of the capacitor C to the gate electrode 18 of the transistor Tr. A passivation film 16 is so formed as to entirely cover the surfaces of the interconnecting layers 10 and 20 and the insulating interlayer 9.

This structure shown in FIGS. 2, 3A, and 3B employs a structure generally called COP (Capacitor On Plug). When this COP is used, the lower electrode 6 of the capacitor C is directly connected to the diffusion layer 32, so the element area can be reduced. However, the device of this embodiment can also be constructed without using this COP.

Figure 4:
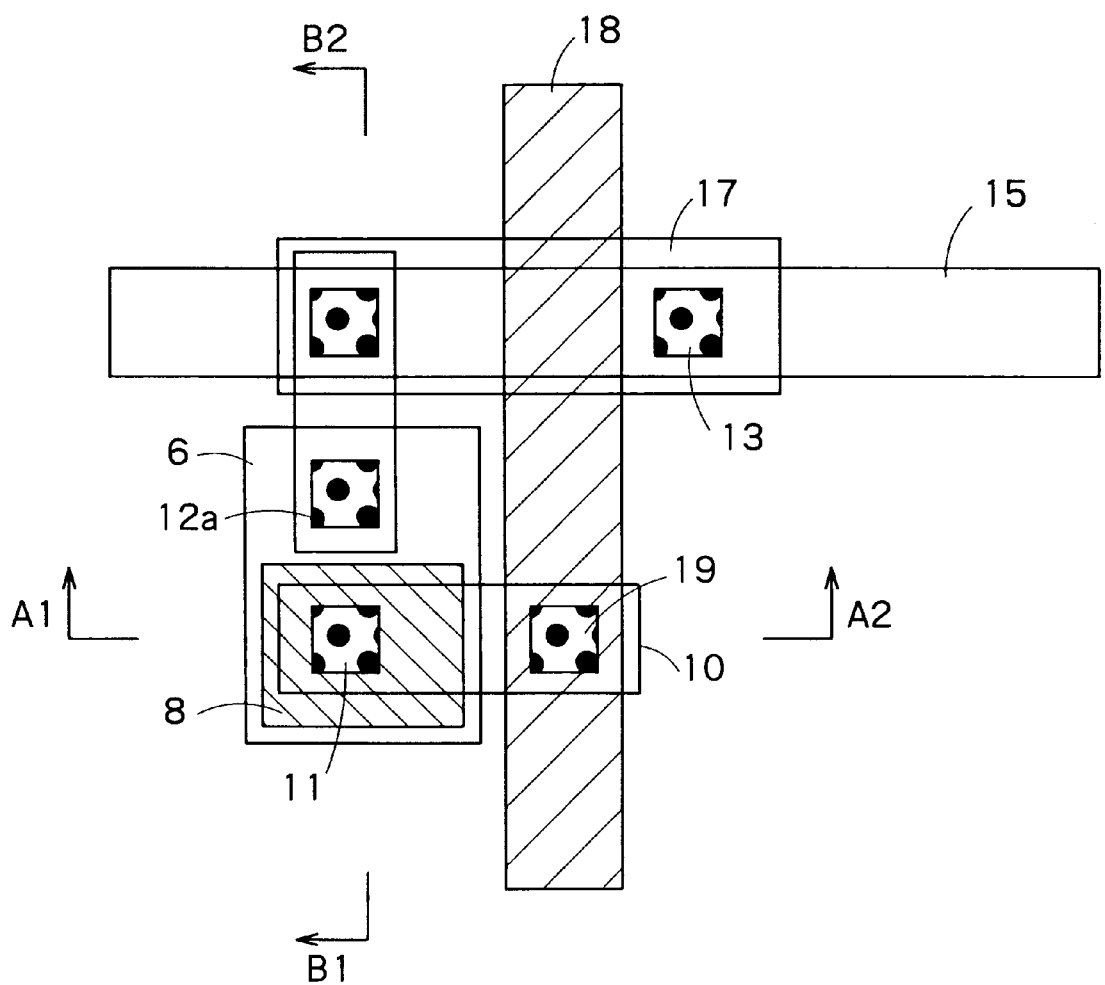
FIG. 4 is a plan view showing an example not using a COP as a plane structure of the cell shown in FIG. 1.
Figure 5B:
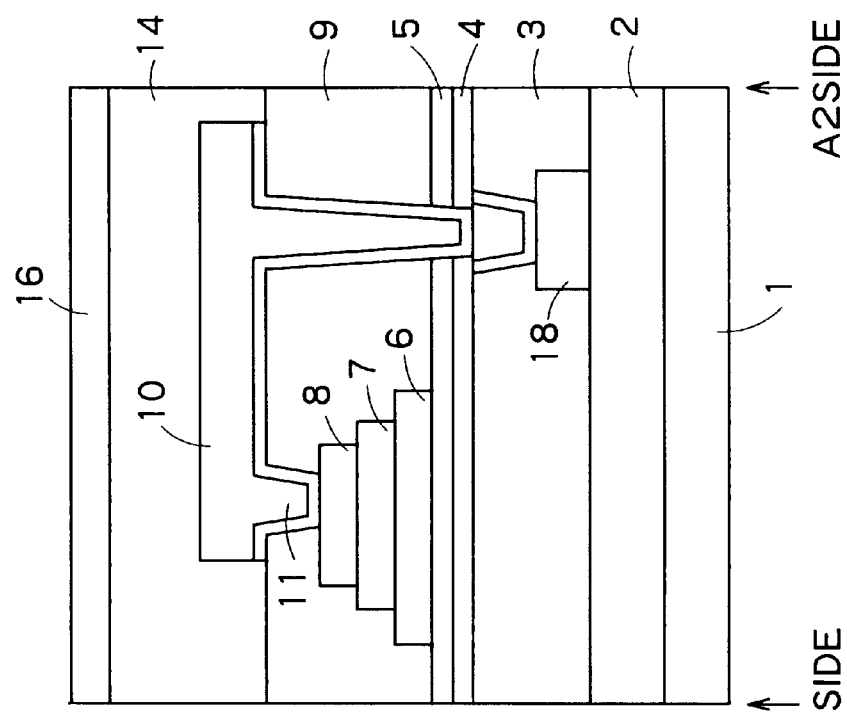
FIGS. 5A and 5B are sectional views showing longitudinal sectional structures taken along a line B1–B2 and a line A1–A2, respectively, in FIG. 4.
Figure 5A:
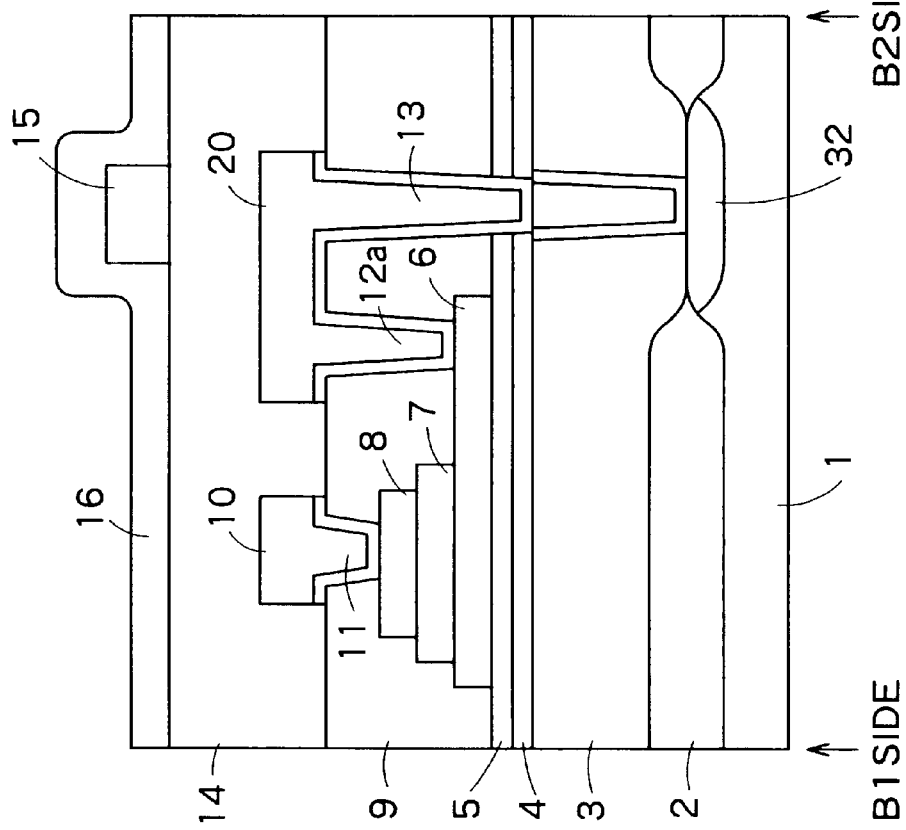

The plane structure of the device in this case is shown in FIG. 4. FIG. 5A shows a longitudinal sectional structure taken along a line B1–B2 in FIG. 4. FIG. 5B shows a longitudinal sectional structure taken along a line A1–A2 in FIG. 4.

The lower electrode 6 of the capacitor C is connected to the first interconnecting layer 20 via a contact hole 12a. This first interconnecting layer 20 is connected to the diffusion layer 32 via a contact hole 13. In this way, the lower electrode 6 and the diffusion layer 32 are connected.

Additionally, a third insulating interlayer 14 is formed to cover the first interconnecting layers 10 and 20 and the second insulating interlayer 9. A second interconnecting layer 15 is formed on the surface of this insulating interlayer 14. The passivation film 16 is formed on the surface of this second interconnecting layer 15.

Methods of writing data in and reading out data from the memory cell according to this embodiment will be described below. For the descriptive convenience, letting NA be a node for connecting the other terminal of the transistor Tr to one terminal of the ferroelectric capacitor C, and NB be a node for connecting the other terminal of the ferroelectric capacitor C to the gate of the transistor Tr. Also, when the gate voltage is a ground voltage Vss, a threshold value Vth of the transistor Tr is preferably as low as possible within the range in which the transistor Tr is turned off. Furthermore, it is desirable that the substrate bias effect be suppressed.

Figure 8:
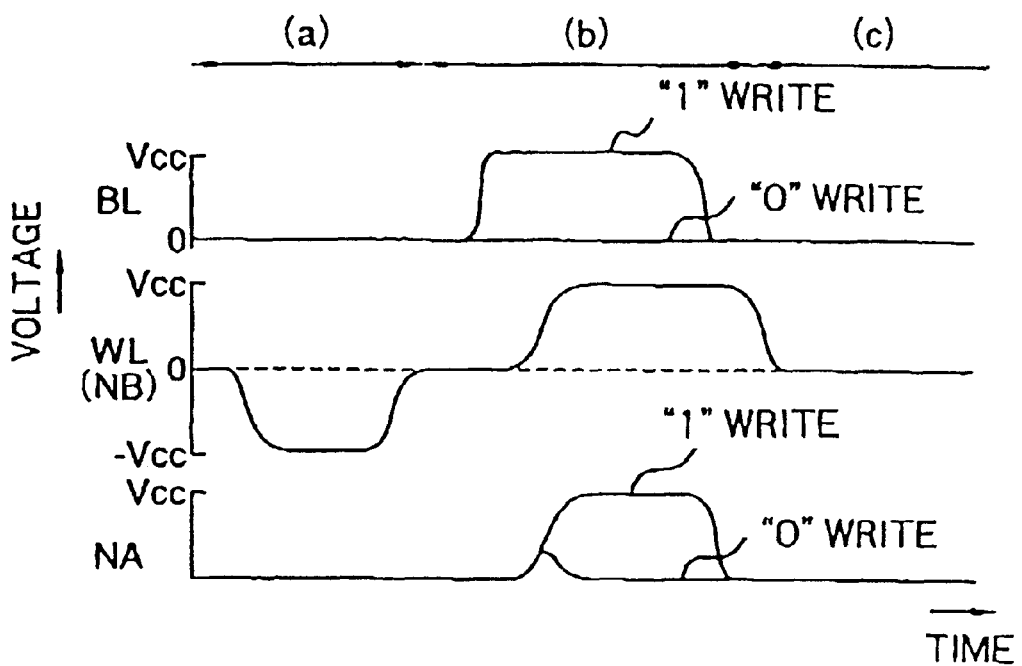
FIG. 8 is a timing chart showing potential changes in a bit line, a word line, and a node NA over time when data is written in the semiconductor memory.

First, the data write procedure will be described below with reference to FIG. 6 showing the potentials of the individual control lines and a timing chart in FIG. 8. In step (a), the potential of the word line WL is set to −Vcc level, and the bit line BL is grounded. Since the transistor Tr is OFF, the node NA is kept disconnected from the bit line BL. However, the p-n junction between the semiconductor substrate and the diffusion layers of the transistor Tr connects the node NA to the semiconductor substrate. Accordingly, even when the potential of the node NB drops to −Vcc as the potential of the word line WL is set to −Vcc, the potential at the node NA maintains the ground voltage Vss without being influenced by the potential at the node NB. Consequently, a voltage Vcc is applied across the ferroelectric capacitor C, so downward polarization is stored.

In step (b), the power supply voltage Vcc is applied to the word line WL. Additionally, the potential of the bit line BL is set to the ground voltage Vss or the power supply voltage Vcc in accordance with data to be written in the cell. That is, when data "0" is to be written, the ground voltage Vss is applied to the bit line BL; when data "1" is to be written, the power supply voltage Vcc is applied. Consequently, the potential at the node NB changes to Vcc level, and the potential at the node NA changes to the same level as the bit line BL. When data "0" is to be written, the voltage Vcc is applied across the ferroelectric capacitor C, so the polarization changes from downward to upward. When data "1" is to be written, the voltage applied across the ferroelectric capacitor C is 0 V, so no polarization change takes place.

In step (c), the potential of the word line WL is returned to the ground potential Vss, and subsequently the potential of the bit line BL is returned to the ground potential Vss. In this step (c), no polarization change occurs in the ferroelectric capacitor C. Through these steps (a) to (c), upward polarization is stored in the ferroelectric capacitor C when data "0" is written, and downward polarization is stored in the ferroelectric capacitor C when data "1" is written.

Figure 9:
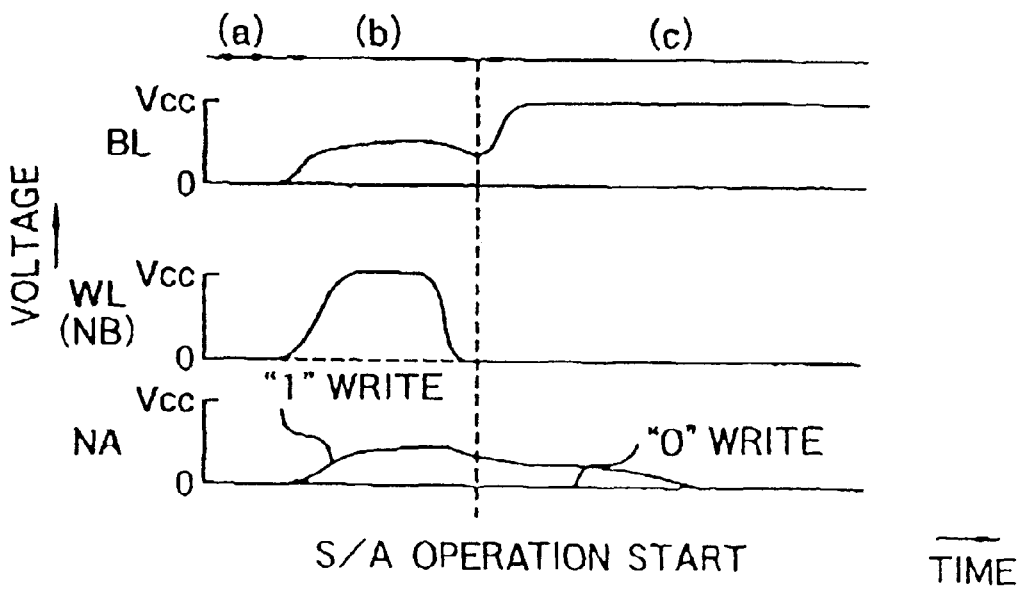
FIG. 9 is a timing chart showing potential changes in the bit line, the word line, and the node NA over time when data is read out from the semiconductor memory.

Next, a procedure of reading out data stored in the ferroelectric capacitor C will be described with reference to FIGS. 7 and 9. In step (a), as a precharge cycle, the bit line BL is set at the level of the ground voltage Vss. A sense amplifier (not shown) is kept disconnected from the bit line BL. The potential of the word line WL is set at the ground voltage Vss. Consequently, both the nodes NA and NB are set at the ground voltage Vss.

In step (b), the power supply voltage Vcc is applied to the word line WL. Accordingly, the potential at the node NB is also set at the power supply voltage Vcc. If data "0" is stored in the ferroelectric capacitor C, the polarization direction remains the same even when the potential of the node NB changes to Vcc. If data "1" is stored in the ferroelectric capacitor C, the polarization direction changes from downward to upward when the potential at the node NB changes to Vcc. In accordance with this polarization inversion, electric charge moves from the ferroelectric capacitor C to the bit line BL. Accordingly, the potential of the bit line BL rises from the ground potential Vss to, e.g., about 0.7 V.

In step (c), the potential of the word line WL is returned to the ground voltage Vss. If data "0" is written, no polarization change occurs in the ferroelectric capacitor C as in step (b), and the potential of the bit line BL keeps the ground voltage Vss. If data "1" is written, the potential of the bit line BL which has risen in step (b) is maintained. The sense amplifier amplifies the potential of the bit line BL to read out the stored data. This read operation destroys the data held in the ferroelectric capacitor C. Therefore, the write operation must be again performed subsequently to the read operation.

Figure 10:
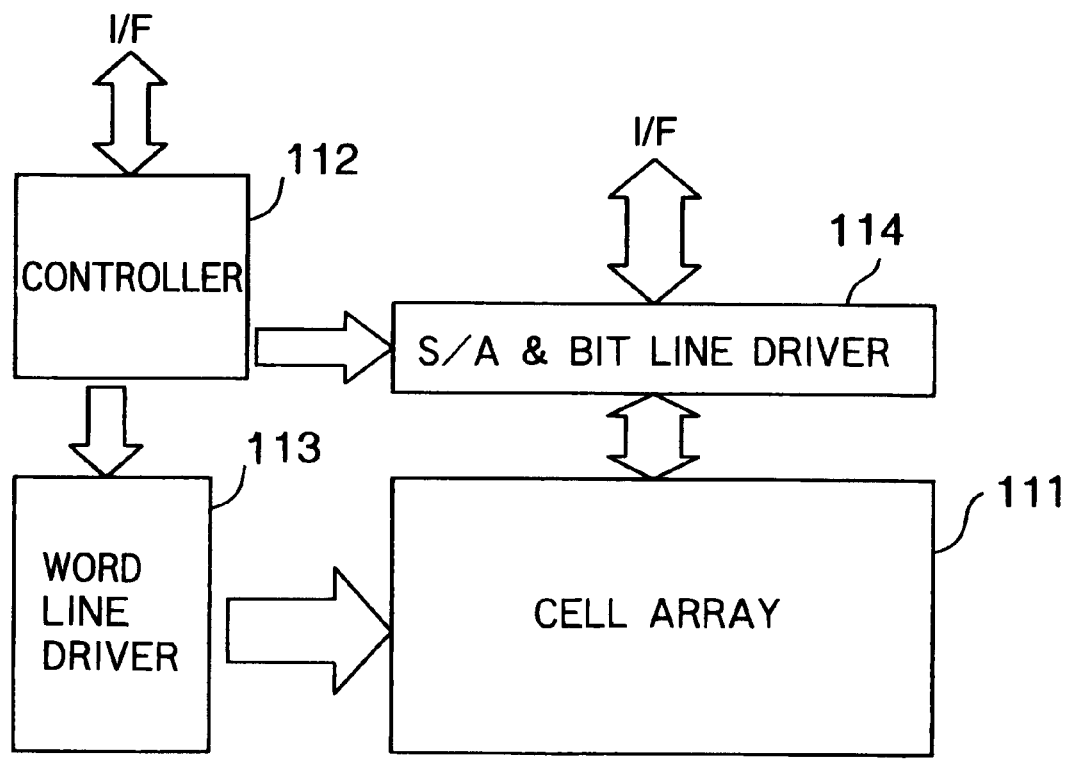
FIG. 10 is a block diagram showing the arrangement of the semiconductor memory.
Figure 25:
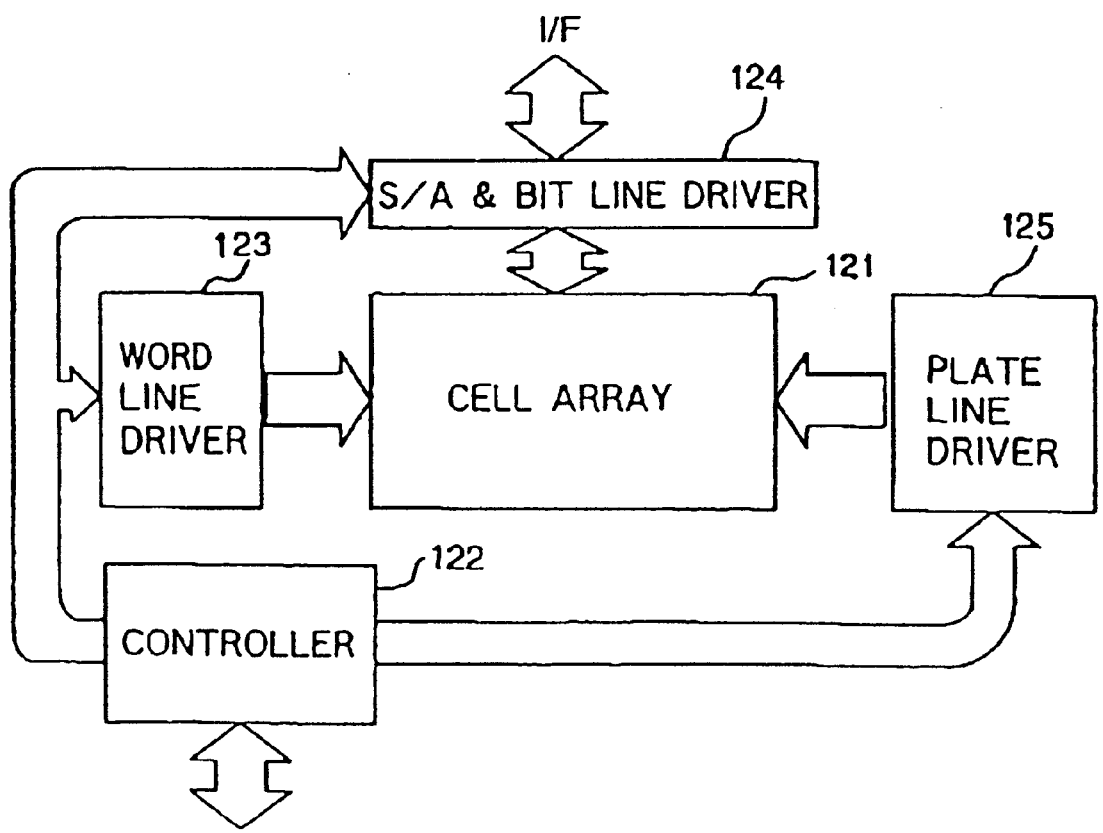
FIG. 25 is a block diagram showing the arrangement of the semiconductor memory relevant to the present invention.

FIG. 10 shows the arrangement of the semiconductor memory according to this embodiment. This semiconductor memory includes a cell array 111 in which cells each having the configuration shown in FIG. 1 are arranged in a matrix, a word line driver 113 for driving the word line WL, and a sense amplifier and a bit line driver 114 for driving the bit line BL and amplifying and reading out the potential of the bit line BL. Unlike the conventional memory shown in FIG. 25, no plate line driver is necessary because no plate line PL exists. In this embodiment as described above, in write and read operations, it is necessary to drive only the two control lines, i.e., the word line WL and the bit line BL. This facilitates design of control line driving timings and circuit design. Also, the chip area can be reduced.

A write method of a semiconductor memory according to the second embodiment of the present invention will be described below. A cell circuit configuration is identical with that of the first embodiment shown in FIG. 1, and a read method is also identical with that of the first embodiment.

Figure 12:
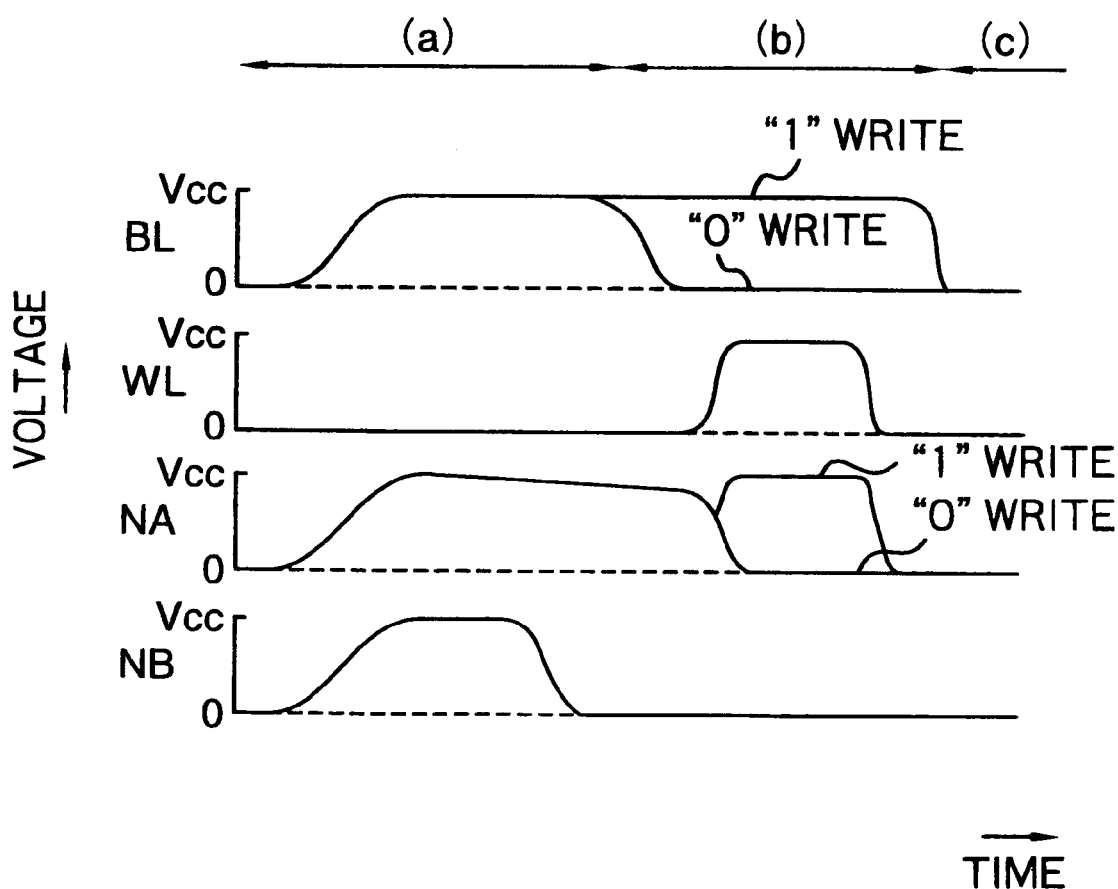
FIG. 12 is a timing chart showing potential changes in a bit line, a word line, a node NA, and a node NB over time when data is written in the semiconductor memory.

FIG. 11 shows the data write procedure according to the second embodiment. FIG. 12 shows voltage changes in a bit line BL, a word line WL, nodes NA and NB, and a semiconductor substrate over time during the procedure. In step (a), a ground voltage Vss is applied to the word line WL, and a power supply voltage Vcc is applied to the bit line BL and the semiconductor substrate. The node NA is disconnected from the bit line BL because a transistor Tr is turned off. However, the p-n junction between the semiconductor substrate and the diffusion layers of the transistor Tr connects the node NA to the substrate. Accordingly, when the voltage Vcc is applied to the substrate, the potential at the node NA changes to the power supply voltage Vcc. The power supply voltage Vcc is applied across a ferroelectric capacitor C, so downward polarization develops.

In step (b), the power supply voltage Vcc or the ground voltage Vss is applied to the bit line BL in accordance with data to be written. That is, when data "0" is to be written, the bit line BL is grounded; when data "1" is to be written, the power supply voltage Vcc is applied. The power supply voltage Vcc is applied to the word line WL. Consequently, the potential at the node NB changes to Vcc, and the potential at the node NA changes to the same level as the bit line BL. When data "0" is to be written, the voltage Vcc is applied across the ferroelectric capacitor C, so the polarization changes from downward to upward. When data "1" is to be written, the voltage applied across the ferroelectric capacitor C is 0 V, so no polarization change takes place.

In step (c), the potential of the word line WL is returned to the ground potential Vss. No polarization changes occurs in the ferroelectric capacitor C. Through these steps (a) to (c), upward polarization is stored in the ferroelectric capacitor C when data "0" is written, and downward polarization is stored in the ferroelectric capacitor C when data "1" is written.

In this embodiment, the word line WL of an unselected cell must be grounded in all the write steps. This is so because if in step (a) the substrate potential of an unselected cell changes to Vcc simultaneously with the substrate potential of a selected cell, data in this unselected cell is destroyed. Therefore, it is necessary to divide the well in units of word lines to be able to apply different substrate potentials to a selected cell and an unselected cell. That is, instep (a), the substrate potential Vcc is applied to a well in which a selected cell is formed, and a well in which an unselected cell is formed is grounded. To thus divide the well, it is also possible to form, in a semiconductor substrate of one conductivity type, a well of the opposite conductivity type for each word line and form an element by forming a well of one conductivity type in this opposite-conductivity well.

Figure 13:
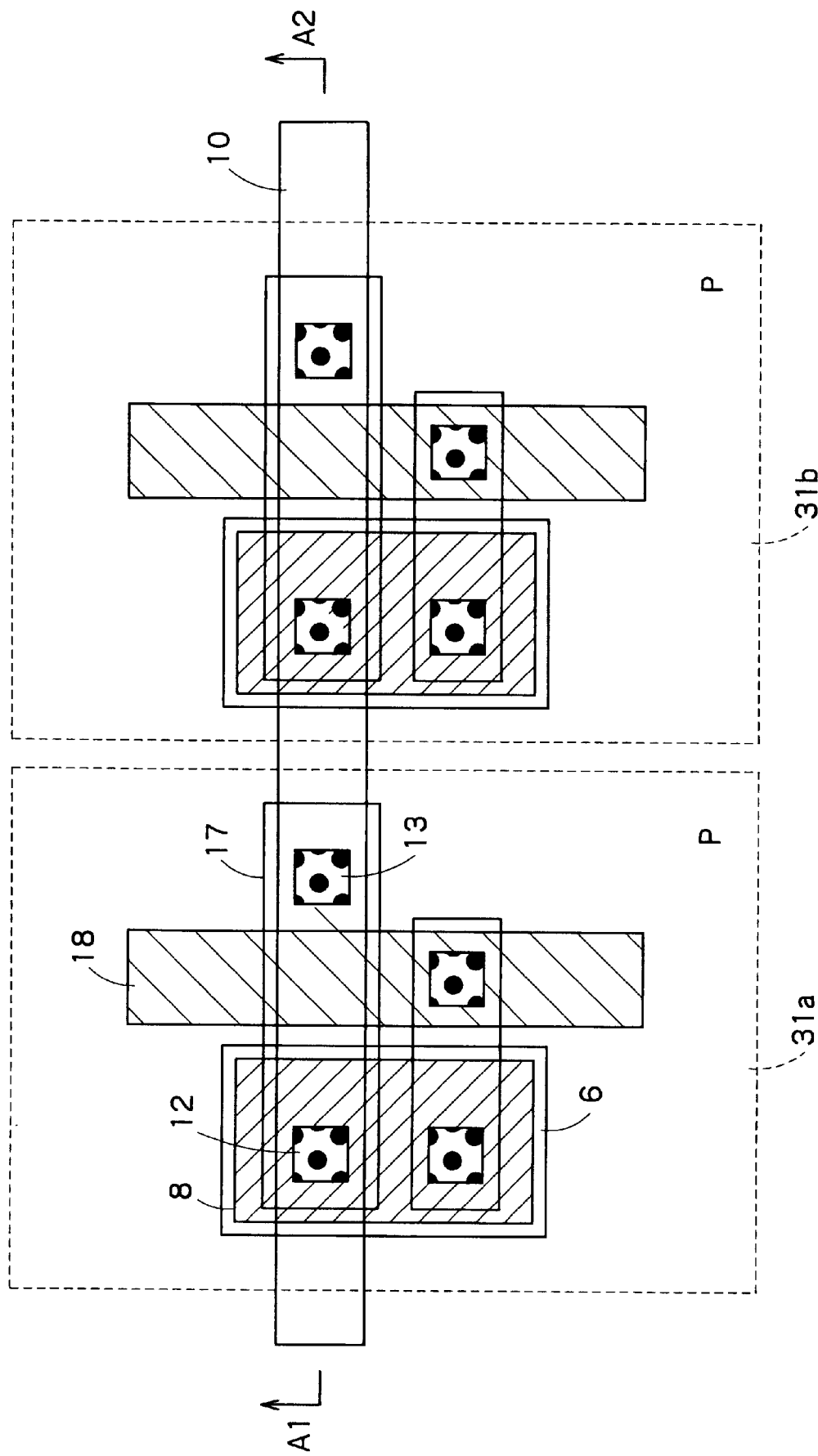
FIG. 13 is a plan view showing a structure in which wells are isolated in a cell according to the second embodiment.
Figure 14:
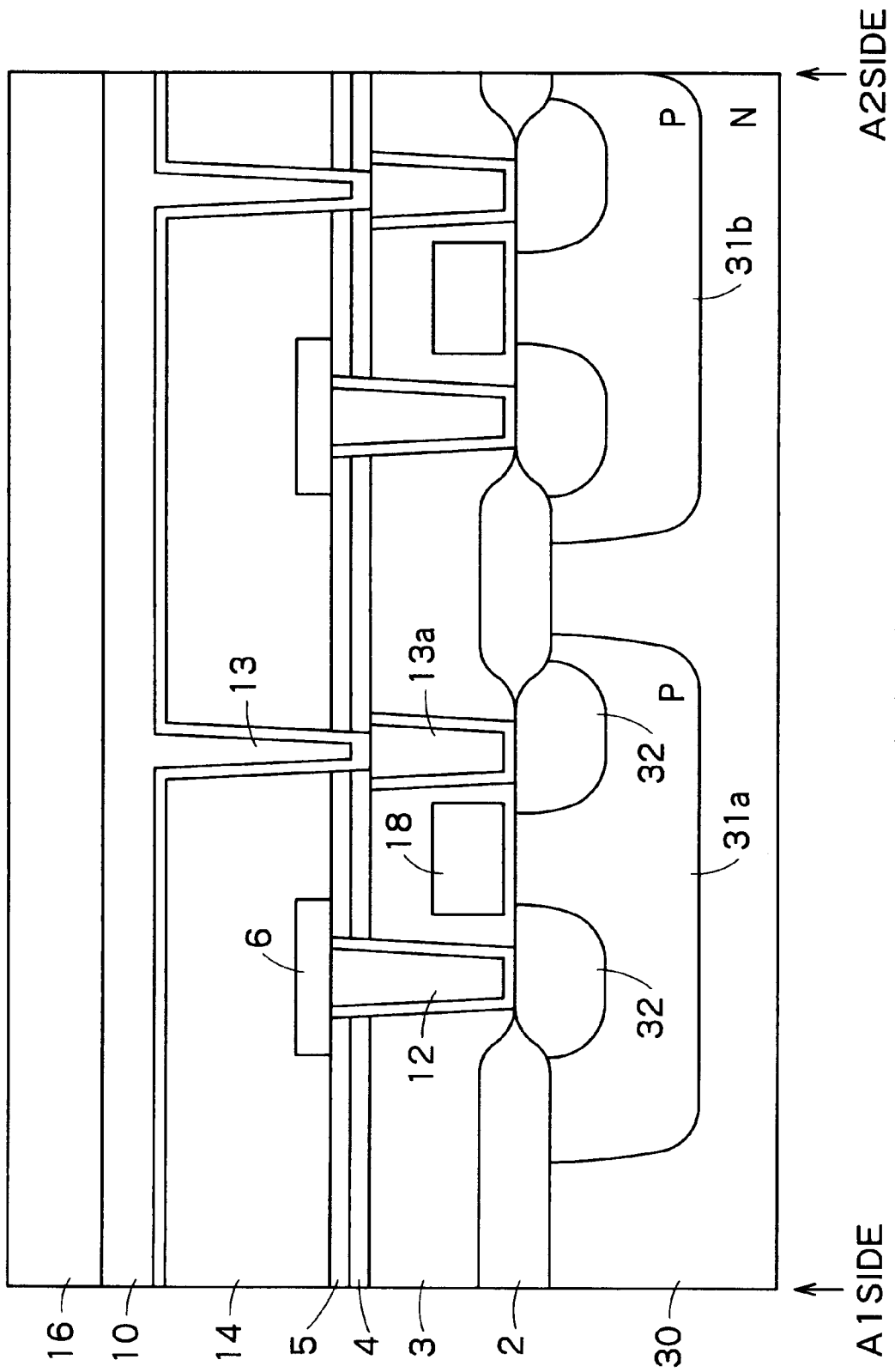
FIG. 14 is a sectional view showing a longitudinal sectional structure taken along a line A1–A2 in FIG. 13.

The plane structure of the memory according to this embodiment is shown in FIG. 13. FIG. 14 shows a longitudinal sectional structure take along a line A1–A2 in FIG. 13.

In a surface portion of an n-type silicon substrate 30, a plurality of p-type wells 31a and 31b are formed for each word line. In each of these wells 31a and 31b, diffusion layers 32 of the transistor Tr are formed. One diffusion layer 32 and a lower electrode 6 of the capacitor C are connected via a contact hole 12. The other diffusion layer 32 is connected to a first interconnecting layer 10 via contact holes 13 and 13a.

Alternatively, an element isolation region (e.g., Shallow Trench Insulator) reaching an internal oxide film can be formed on an SOI (Silicon On Insulator) substrate to thereby isolate the substrate itself.

FIG. 15 shows the longitudinal sectional structure of the element in this case. A silicon substrate 1 is formed on the surface of a substrate 40 made of a silicon oxide film. This silicon substrate 1 is isolated into a plurality of regions by a silicon oxide film 41 formed by shallow trench element isolation. Diffusion layers 32 of the transistor Tr are formed in a surface portion of each isolated region. The rest of the structure is the same as the structure using the wells shown in FIG. 14, so a detailed description thereof will be omitted.

In this embodiment, as in the first embodiment described earlier, only the bit line BL and the word line WL need be controlled during write operation. This facilitates design of control line driving timings and circuit design. Also, the chip area can be reduced.

Furthermore, in this embodiment, no negative voltage (−Vcc) need be generated, unlike in the first embodiment. This facilitates designing a peripheral circuit for generating voltages. However, in the second embodiment, it is necessary to change the substrate potential. Generally, the substrate capacitance is large, so it takes a long time to change the substrate potential. Accordingly, the operating time required for write operation is shorter in the first embodiment.

A write method according to the third embodiment of the present invention differs from the above second embodiment in the voltage applied to an unselected cell. A cell circuit configuration and a read method are identical with those of the first and second embodiments.

In the second embodiment, in write step (a), the potential of the word line WL is set at the ground potential Vss for both a selected cell and an unselected cell. The substrate potential of the selected cell is set at the power supply voltage Vcc, and the substrate potential of the unselected cell is set at the ground potential Vss. In this third embodiment, however, the word line WL of a selected cell is set to the ground voltage Vss, and the power supply voltage Vcc is applied to the word line WL of an unselected cell. The potential of the word line WL of this unselected cell must be changed at the same timing as the substrate potential change. Consequently, nodes NA and NB of the unselected cell become equal in potential, so no voltage is applied across the ferroelectric capacitor C, and no polarization change takes place. In subsequent steps (b) and (c), the potential of the word line WL of the unselected cell is set at the ground voltage Vss, as in the second embodiment.

In this write method according to the third embodiment, the well need not be isolated in units of word lines WL, unlike in the second embodiment. This simplifies the fabrication process and also contributes to reduction of the element area.

The aforementioned embodiments are merely examples and hence do not restrict the present invention. Also, the cell structure of each of the semiconductor memories according to the first to third embodiments is as shown in FIG. 1. One terminal of the ferroelectric capacitor C and the word line WL in each cell can be connected as follows.

Figure 16:
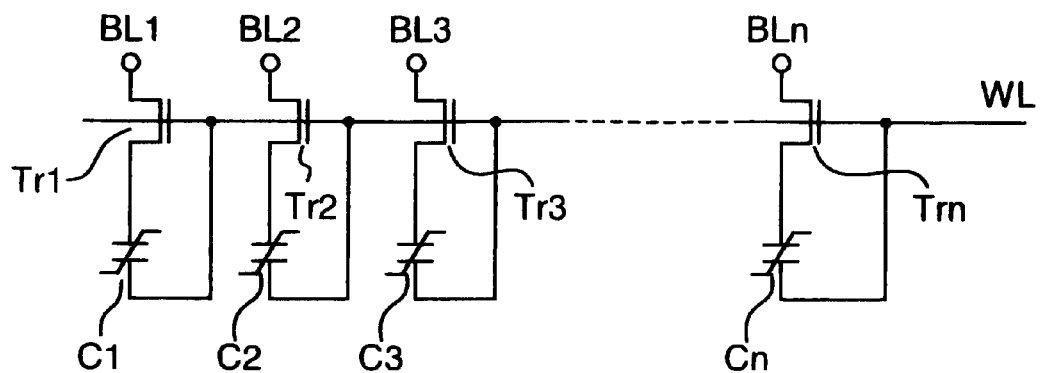
FIG. 16 is a circuit diagram showing an example of the cell arrangement of the semiconductor memories according to the first to third embodiments of the present invention.

In a circuit shown in FIG. 16, one terminal of each of ferroelectric capacitors C1, C2, C3, . . . , Cn incells is connected to the word line WL. Since the wiring length in each cell is short, the operating speed can be increased. In a circuit shown in FIG. 17, a plurality of cells construct one block, and terminals on the same side of ferroelectric capacitors C1, C2, and C3 in one block are connected together to the word line WL. In a circuit shown in FIG. 18, terminals on the same side of ferroelectric capacitors C1, C2, . . . , Cn in all cells are connected together to the word line WL. This wiring decreases the wiring region and contributes to reduction of the chip area. One terminal of each ferroelectric capacitor and a word line can be connected by any of these methods shown in FIGS. 16, 17, and 18.

Figure 17:
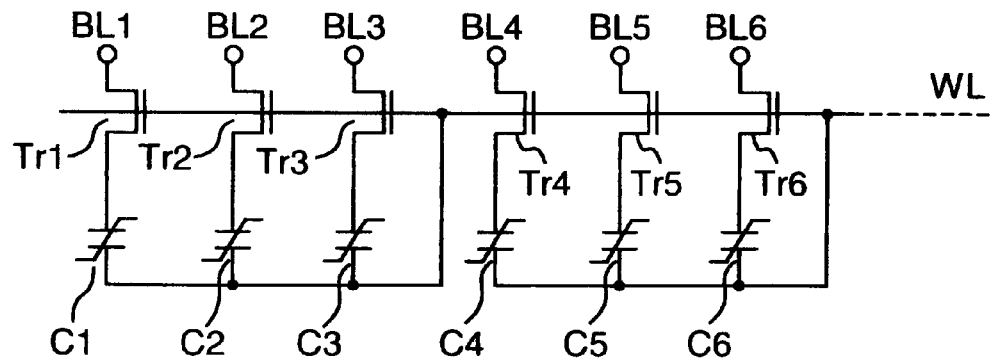
FIG. 17 is a circuit diagram showing another example of the cell arrangement of the semiconductor memories according to the first to third embodiments of the present invention.
Figure 18:
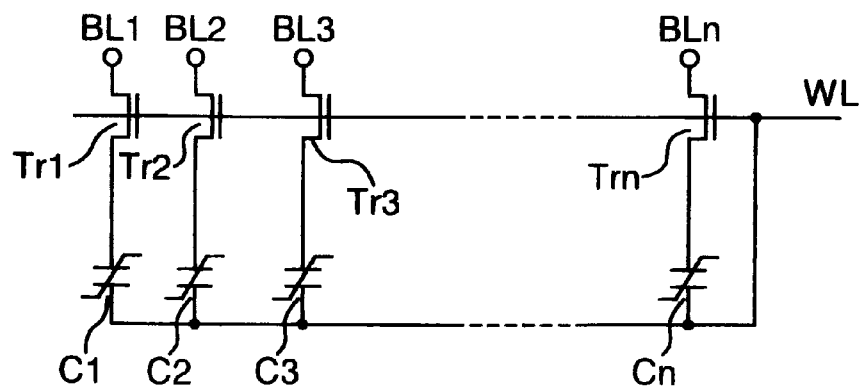
FIG. 18 is a circuit diagram showing still another example of the cell arrangement of the semiconductor memories according to the first to third embodiments of the present invention.
Figure 19:
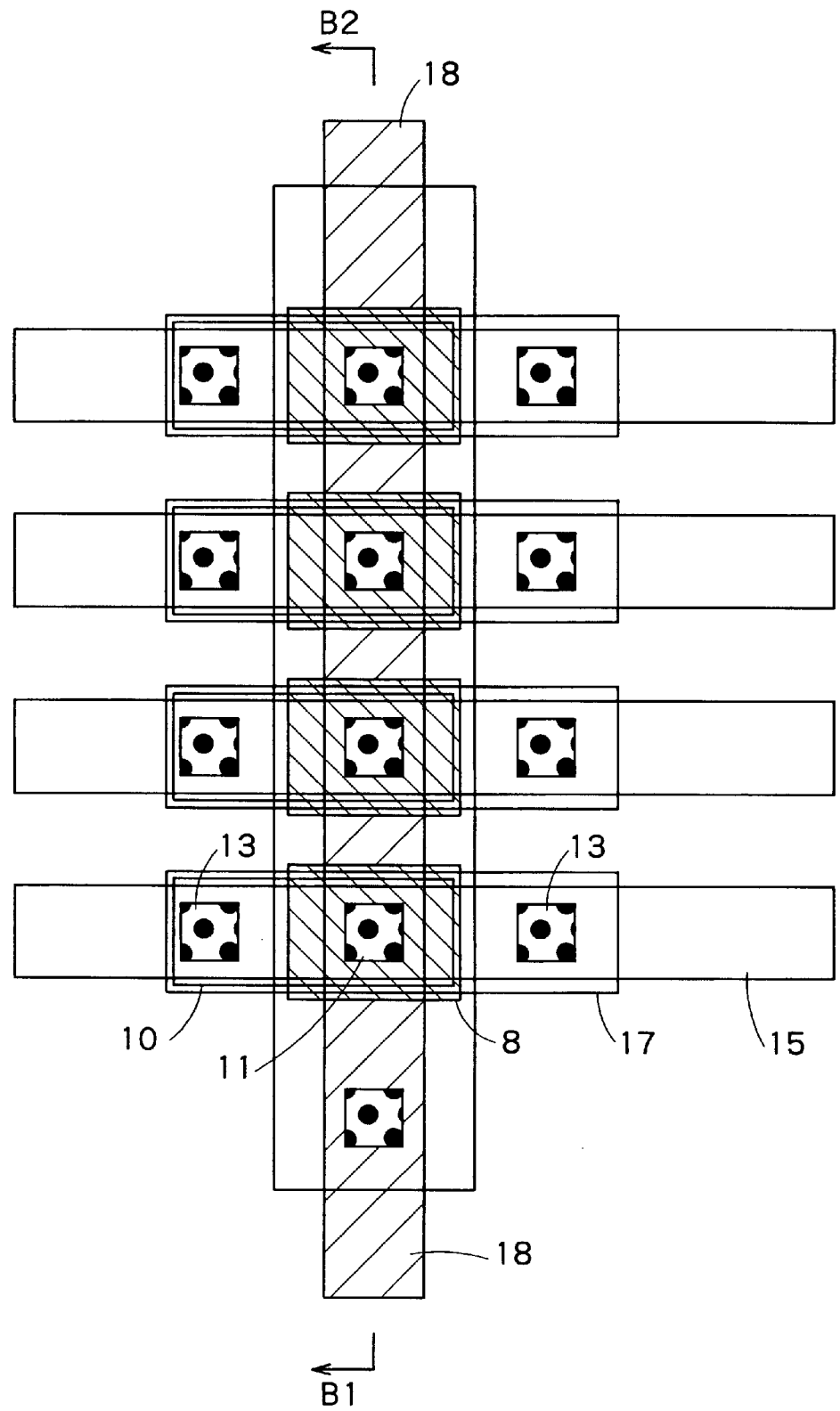
FIG. 19 is a plan view showing an example of the plane structure of the cell shown in FIGS. 17 or 18.
Figure 20:
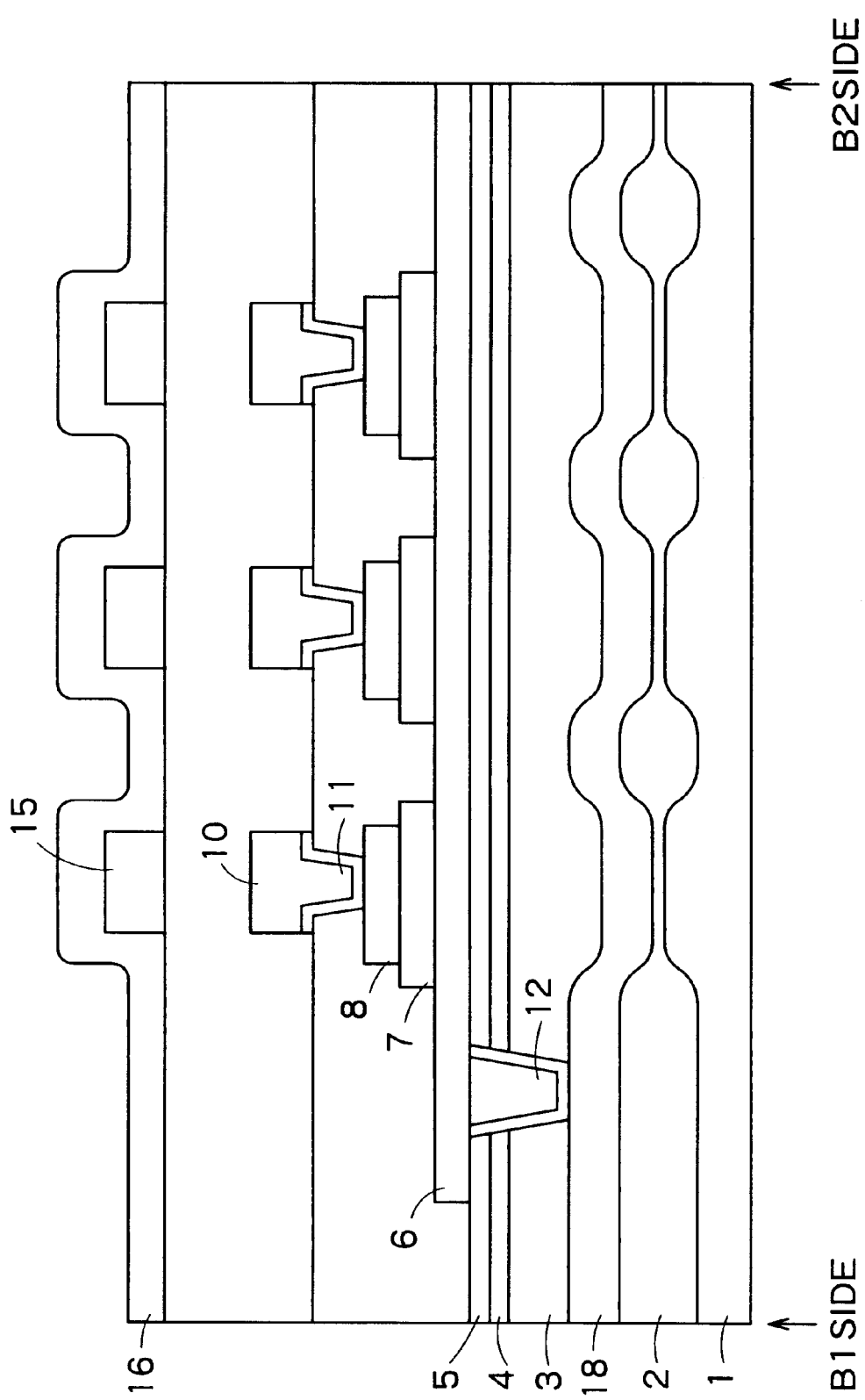
FIG. 20 is a sectional view showing a longitudinal sectional structure taken along a line B1–B2 in FIG. 19.

FIG. 19 shows a plane structure when, as shown in FIG. 17 or 18, a common lower electrode of a plurality of capacitors C1, C2, . . . , is connected to the gates of transistors Tr1, Tr2, . . . FIG. 20 shows a longitudinal sectional structure taken along a line B1–B2 in FIG. 19.

A common lower electrode 6 of a plurality of capacitors is connected to a gate electrode 18 of a transistor via a contact hole 12. Also, an upper electrode 8 of each capacitor is connected to a first interconnecting layer 10 via a contact hole 11. This interconnecting layer 10 is connected to one diffusion layer 17 of a transistor via a contact hole 13. This arrangement can also realize a connection between one terminal of each of ferroelectric capacitors C in a plurality of cells and the word line WL.

What is claimed is:

1. A semiconductor memory comprising:
   a cell including one transistor and one ferroelectric capacitor formed on the same semiconductor region, in which one of a source and a drain of said transistor is connected to a first terminal of said ferroelectric capacitor;
   a bit line connected to the other of said source and said drain of said transistor; and
   a word line connected directly to a second terminal of said ferroelectric capacitor and a gate of said transistor.

2. A memory according to claim 1, further comprising:
   a memory cell array in which a plurality of cells are arranged;
   a word line driver for driving said word line;
   a bit line driver for writing data in said cells by driving said bit line; and
   a sense amplifier for reading out data from said cells on the basis of a potential of said bit line.

3. A memory according to claim 1, wherein
   said semiconductor memory comprises a plurality of cells and a plurality of word lines,
   a plurality of semiconductor regions having a different conductivity type from a conductivity type of a semiconductor substrate and electrically isolated from each other are formed on said semiconductor substrate, and
   at least one of said plurality of cells is formed in each of said semiconductor regions, said cells formed in each semiconductor region being connected to the same word line.

4. A memory according to claim 3, further comprising:
   a memory cell array in which a plurality of cells are arranged;
   a word line driver for driving said word lines;
   a bit line driver for writing data in said cells by driving said bit line; and
   a sense amplifier for reading out data from said cells on the basis of a potential of said bit line.

5. A memory according to claim 1, wherein
   said semiconductor memory comprises a plurality of cells each connected to one of a plurality of selected word lines, and
   in a write operation, a predetermined voltage is applied between a selected word line and a semiconductor substrate in which a cell connected to said word line is formed, and no voltage is applied between an unselected word line and a semiconductor substrate in which a cell connected to said unselected word line is formed.

6. A memory according to claim 5, further comprising:
   a memory cell array in which a plurality of cells are arranged;
   a word line driver for driving said word lines;
   a bit line driver for writing data in said cells by driving said bit line; and
   a sense amplifier for reading out data from said cells on the basis of a potential of said bit line.

7. In a semiconductor memory comprising a cell including one transistor and one ferroelectric capacitor formed on the same semiconductor region, a bit line, and a word line, wherein one of a source and a drain of said transistor is connected to a first terminal of said ferroclectric capacitor, the other of said source and said drain of said transistor is connected to said bit line, and a second terminal of said ferroclectric capacitor and a gate of said transistor are connected to said word line, a method of writing data comprising the steps of:

applying a first voltage, which generates polarization in a first direction in said ferroelectric capacitor, between said semiconductor region in which said cell is formed and said word line; and applying a fourth voltage which turns on said transistor while a second or third voltage is applied to said bit line, if the second voltage is applied to said bit line, writing first data while the first polarization is kept generated in said ferroelectric capacitor, and, if the third voltage is applied to said bit line, writing second data while polarization in a second direction different from the direction of the first polarization is generated in said ferroelectric capacitor.

8. A method according to claim 7, wherein polarity of the first voltage is negative when said transistor is an n-type field-effect transistor.

9. In a semiconductor memory comprising a cell including one transistor and one ferroelectric capacitor formed on the same semiconductor region, a bit line, and a word line, wherein one of a source and a drain of said transistor is connected to a first terminal of said ferroelectric capacitor, the other of said source and said drain of said transistor is connected to said bit line, and a second terminal of said ferroelectric capacitor and a gate of said transistor are connected to said word line, a method of reading out data stored in the cell comprising the steps of:

precharging said bit line to a ground potential;

applying a first voltage to said word line, maintaining a polarization direction in said ferroelectric capacitor if first data is stored in said cell, and changing the polarization direction in said ferroelectric capacitor if second data is stored in said cell, thereby changing a potential of said bit line; and grounding said word line to read out the data on the basis of the potential of said bit line.

* * * * *